(12) United States Patent
Ma

(10) Patent No.: US 7,160,128 B2
(45) Date of Patent: Jan. 9, 2007

(54) LAND GRID ARRAY CONNECTOR ASSEMBLY

(75) Inventor: Hao-Yun Ma, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/982,434

(22) Filed: Nov. 5, 2004

(65) Prior Publication Data
US 2005/0106923 A1    May 19, 2005

(30) Foreign Application Priority Data
Nov. 14, 2003  (TW)  .............................. 92220213 U

(51) Int. Cl.
*H01R 13/62* (2006.01)

(52) U.S. Cl. ........................................ 439/331; 439/73

(58) Field of Classification Search ................. 439/71, 439/72, 73 X, 330, 331, 525, 526
See application file for complete search history.

(56) References Cited

U.S. PATENT DOCUMENTS

| 4,341,433 A * | 7/1982 | Cherian et al. ............. 439/525 |
| 4,351,580 A * | 9/1982 | Kirkman et al. .............. 439/71 |
| 4,511,201 A * | 4/1985 | Baker et al. ................ 439/260 |
| 4,692,790 A * | 9/1987 | Oyamada .................... 257/727 |
| 4,761,140 A * | 8/1988 | Geib ........................... 439/71 |

\* cited by examiner

*Primary Examiner*—Thanh-Tam Le
(74) *Attorney, Agent, or Firm*—Wei Te Chung

(57) ABSTRACT

An LGA connector assembly (1) includes an insulative housing (10), a plurality of terminals (12) received in the housing, and a metal clip (40) mounted on the housing. The clip is disposed on the housing to press an LGA chip upon the terminals and has two opposite slant sides (42). A first pressing portion (421) is bent to the housing in a middle portion thereof, and a second pressing portion (422) with a cantilever configuration extending from one end of the first pressing portion. A clasping portion (423) is defined at a distal end of the second pressing portion. When an LGA chip is disposed on the housing, the first pressing portion and the clasping portion can press the LGA chip onto the terminals to prevent the LGA chip moving upwardly relative to the housing, thereby ensuring the reliably electrical connection between the LGA chip and the connector assembly.

8 Claims, 6 Drawing Sheets

LAND GRID ARRAY CONNECTOR ASSEMBLY

BACKGROUND OF THE INVENTION

1. Field of the Invention

The present invention relates to the art of electrical connectors, and more particularly to a land grid array (LGA) connector assembly provided for mechanically and electrically connecting a land grid array (LGA) chip to a printed circuit board (PCB). The instant application relates to a contemporaneously filed application having the same title, the same applicant and the same assignee with the invention.

2. Description of the Prior Art

Land grid array (LGA) electrical connectors are widely used in the connector industry for electrically connecting LGA chips to printed circuit boards (PCBs) in personal computers (PCs). Conventionally, an LGA connector mainly comprises an insulative housing, a multiplicity of terminals received therein, a load plate and a cam lever pivotably mounted on two opposite sides of the housing. The housing defines a multiplicity of terminal passageways in a rectangular array, for interferentially receiving corresponding terminals. Due to the very high density of leads arranged on an LGA chip, the LGA chip needs to be precisely seated on the LGA connector. Thus it is difficult to ensure reliable signal transmission between the terminals and the LGA chip.

Referring to FIGS. 5 and 6, a conventional land grid array connector assembly 8 comprises an insulative housing 82, a plurality of terminals 81 received in the housing 82, a metal stiffener 83 partly covering and reinforcing the housing 82, a load plate 84 pivotably received in an end of the stiffener 83, and a cam lever 85 pivotably mounted to an opposite end of the stiffener 83 for engaging with the cam lever 85. The housing 82 defines four sidewalls and a central cavity disposed between the sidewalls. The central cavity is used for receiving a land grid array (LGA) chip 100 therein. A distal end of the terminal 81 is formed outward from a top surface of the central cavity, for being pressed to engage with a corresponding lead of the LGA chip 100. The load plate 84 comprises two opposite sides 840. A pair of pressing portions 841 is provided in respective middle portions of the sides 840, for pressing the LGA chip 100 engaging with the terminals 81. When the LGA chip 100 engages with the connector assembly 8, the load plate 84 is rotated upward. The LGA chip 100 is placed in the central cavity of the housing 82. The load plate 84 is rotated from a vertical portion to a horizontal portion to make the two opposite sides 840 of the load plate 84 attach on corresponding sides of the LGA chip 100. The cam lever 85 is rotated to drive the load plate 84 to gradually approach the housing 82 until the pressing portions 841 of the sides 840 press the LGA chip 100 downwardly to make the leads of the LGA chip 100 contact with the distal ends of the terminals 81. As a result, mechanical and electrical engagement between the terminals 81 and corresponding leads (not shown) of the LGA chip 100 is attained.

However, because the pressing portion 841 is formed in the middle portion of the load plate 84, when the pressing portions 841 of the load plates 84 press on the LGA chip 100, only one point of the load plate 84 attaches on the LGA chip 100. The pressing force applied on the LGA chip 100 will generate friction between the LGA chip 100 and the housing 82. The friction is prone to make the LGA chip 100 move relative to the housing 82 in vertical direction and spaces are formed between the leads of the LGA chip 100 and the terminals 81. As a result, the reliability of the mechanical and electrical engagement between the leads of the LGA chip 100 and the terminals 81 is decreased. If this happens, the LGA chip 100 can not be secured between the sidewalls reliably, and some terminals 81 are prone not to fully engage the corresponding leads of the LGA chip 100. Uniform engagement between the terminals 81 and the corresponding leads of the LGA chip 100 is destroyed, and even open electrical circuits are liable to establish therebetween. Thus, the reliability of the mechanical and electrical engagement between the terminals 81 and the corresponding leads of the LGA chip 100 is decreased.

Thus, there is a need to provide a new land grid connector assembly that overcomes the above-mentioned problems.

SUMMARY OF THE INVENTION

Accordingly, an object of the present invention is to provide a land grid array (LGA) connector assembly able to ensure that leads of an electrical package electrically connect with the respective terminals of the LGA connector assembly steadily.

To fulfill the above-mentioned object, an LGA connector assembly in accordance with a preferred embodiment comprises an insulative housing, a plurality terminals received in the housing, a metal stiffener engaged with the housing, a metal clip and a cam lever pivotably mounted on two opposite sides of the stiffener. The housing defines a generally rectangular cavity for receiving an electronic package such as an LGA central processing unit (CPU) therein. A multiplicity of terminal-passages is defined in a portion of the housing under the cavity, for receiving a corresponding number of the terminals therein. The clip is disposed on the housing to press the CPU upon the terminals. The clip has two opposite first slant sides and two opposite second slant sides adjacent to the first sides respectively. The second side defines a first pressing portion in a middle portion thereof and a second pressing portion extending from an end of the first pressing portion. The second pressing portion is adjacent to an end of the cam lever engaged with the stiffener and has a cantilever configuration. When the LGA chip is mounted onto the housing, the first and second pressing portions of the metal clip press the respective two portions of the LGA chip to make the leads of the LGA chip electrically connect with the terminals in the housing, thereby reliably electrical and mechanical engagement between the LGA chip and the connector assembly is obtained.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
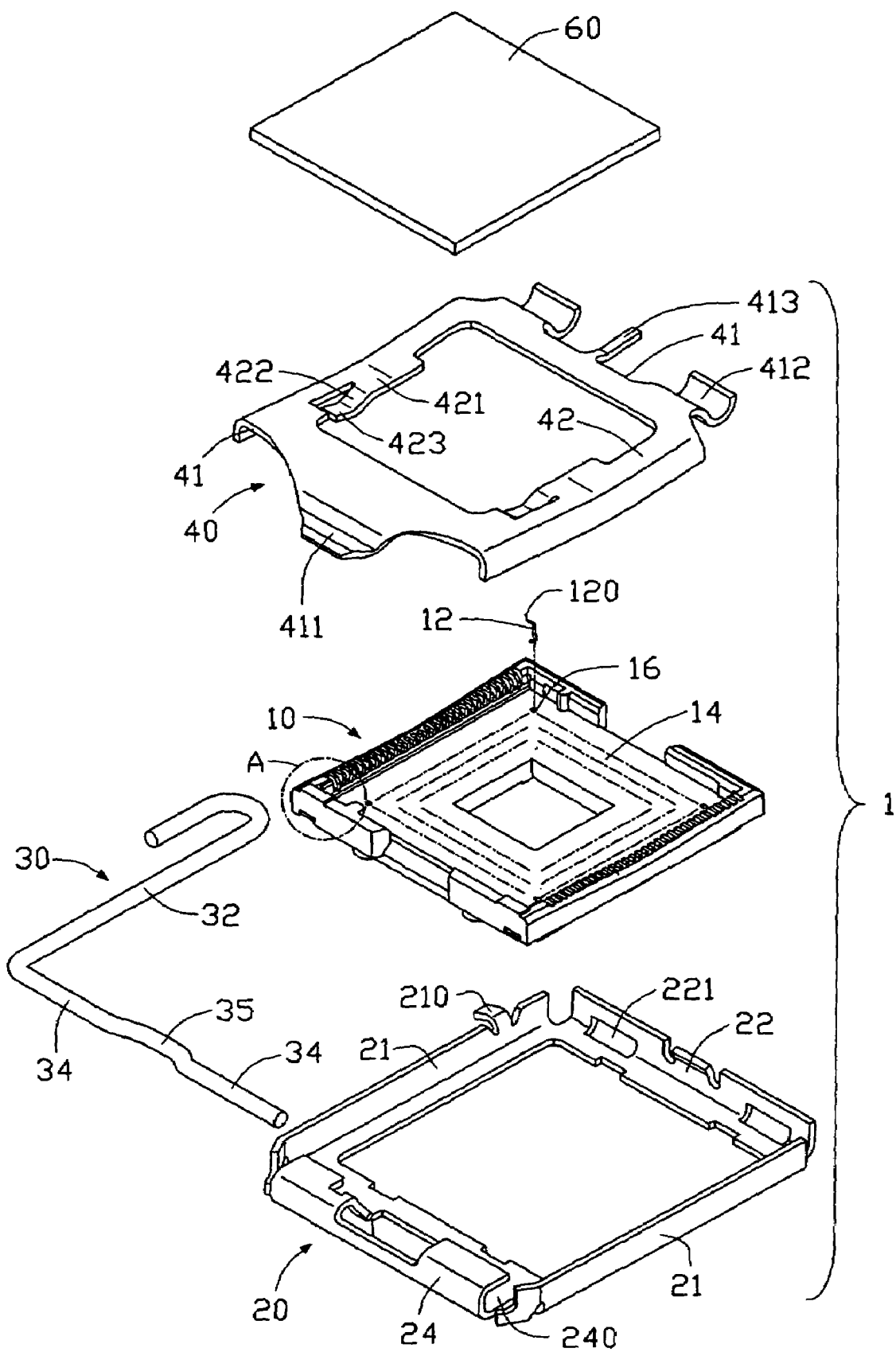
FIG. 1 is an exploded, isometric view of a land grid connector assembly in accordance with a preferred embodiment of the present invention, together with an LGA chip ready to be mounted in a housing of the connector assembly.

FIG. 1 is an exploded, isometric view of a land grid array (LGA) connector assembly 1 in accordance with a preferred embodiment of the present invention. The LGA connector assembly 1 provided for electrically connecting an LGA chip 60 to a PCB (not shown) comprises an a generally rectangular insulative housing 10, a multiplicity of terminals 12 received in the housing 10, a metal stiffener 20 partly covering and reinforcing the housing 10, a cam lever 30 pivotably received in an end of the stiffener 20, and a metal clip 40 pivotably mounted to an opposite end of the stiffener 20 for engaging with the cam lever 30.

The housing 10 defines a generally rectangular cavity 14 in a middle thereof. The cavity 14 is used for receiving the LGA chip 60 therein. A multiplicity of terminal-passages 13 is defined in a portion of the housing 10 under the cavity 14, for receiving a corresponding number of the terminals 12 therein respectively. Each terminal 12 has a first contacting portion 120 protruding outwardly from a top face of the housing 10, for resiliently electrically contacting a corresponding pad of the LGA chip 60.

The stiffener 20 comprises a pair of lateral sides 21 each having an L-shaped cross-section, a front end 24 having a U-shaped cross-section, and a rear end 22 having a substantially L-shaped cross-section. The housing 10 is fittingly received in the stiffener 20. An elongate chamber 240 is defined in the front end 24 of the stiffener 20. A pair of spaced slots 221 is defined in the rear end 22 of the stiffener 20. A locking hook 210 extends arcuately from an edge of one of the lateral sides 21 of the stiffener 20.

The lever 30 comprises a pair of locating portions 34 pivotably received in the chamber 240 of the stiffener 20, an offset actuating portion 35 between the locating portions 34, and an operating portion 32 extending perpendicularly from an end of one of the locating portions 34. The operating portion 32 is disposed outside of the stiffener 20. When oriented at a horizontal position parallel to the housing 10, the operating portion 32 engages with the locking hook 210.

Figure 2:
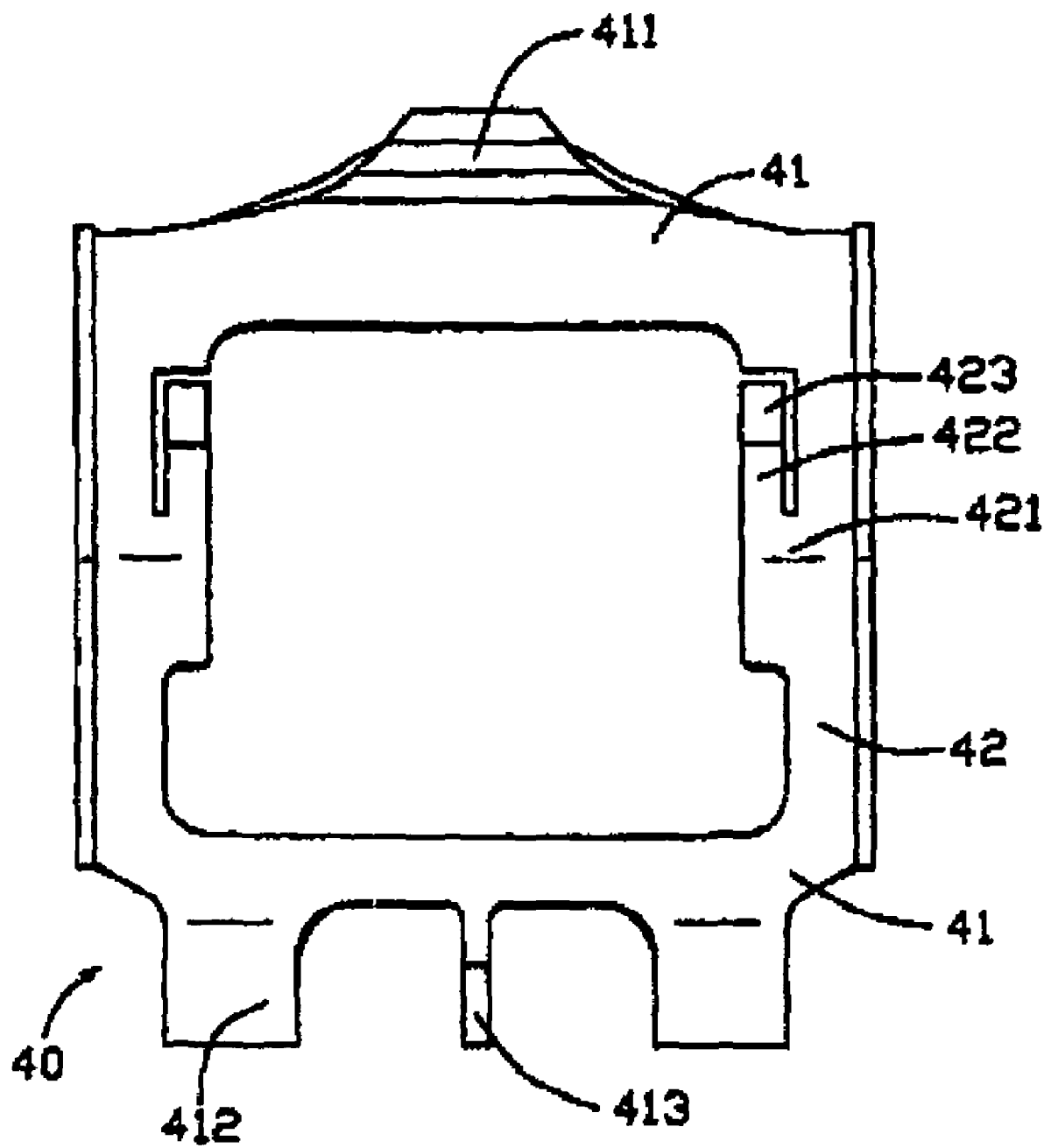
FIG. 2 is an inverted top plan view of a metal clip of FIG. 1.
Figure 3:
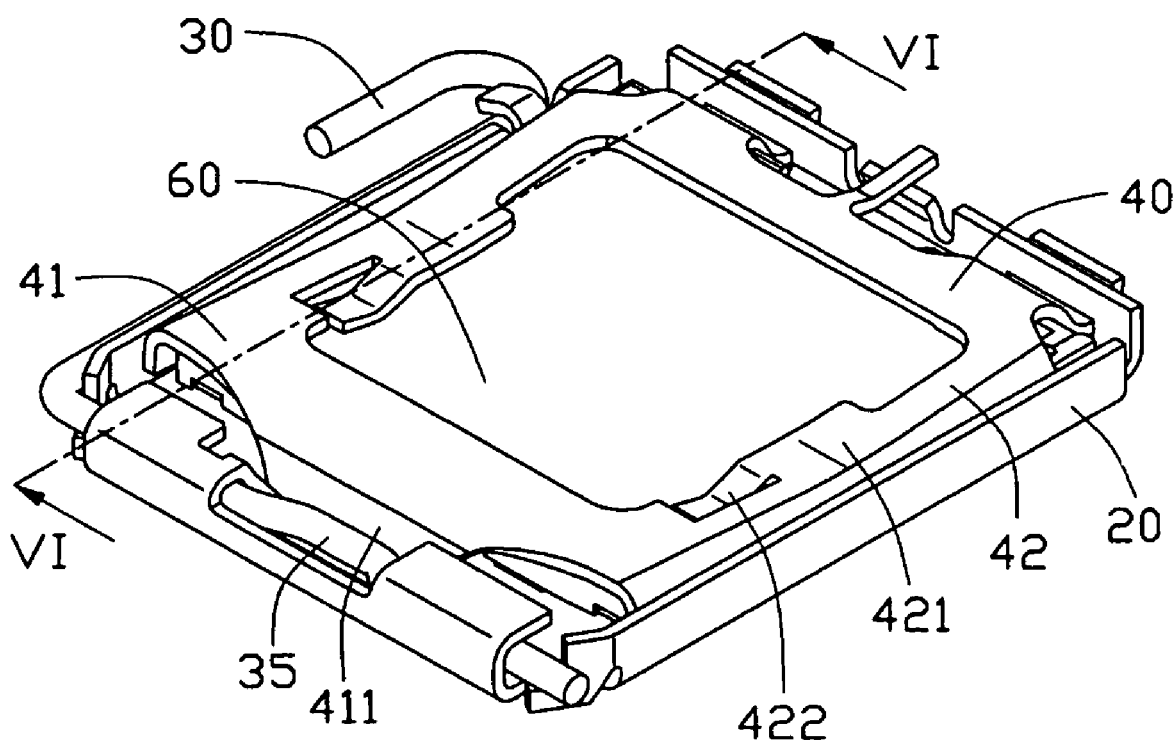
FIG. 3 is an assembled, isometric view of FIG. 1.
Figure 4:
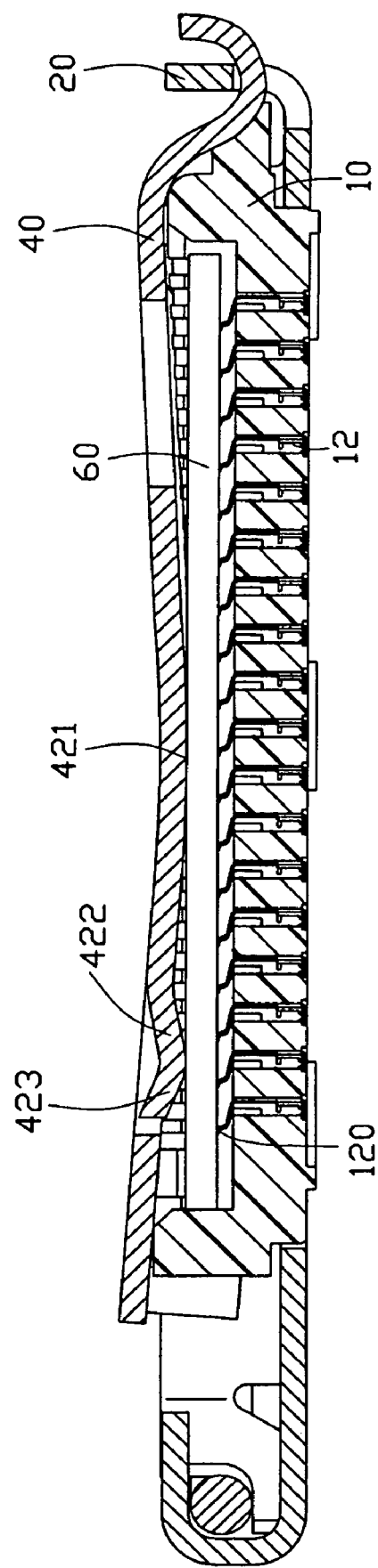
FIG. 4 is a cross-sectional view, taken along line IV—IV of FIG. 3.
Figure 5:
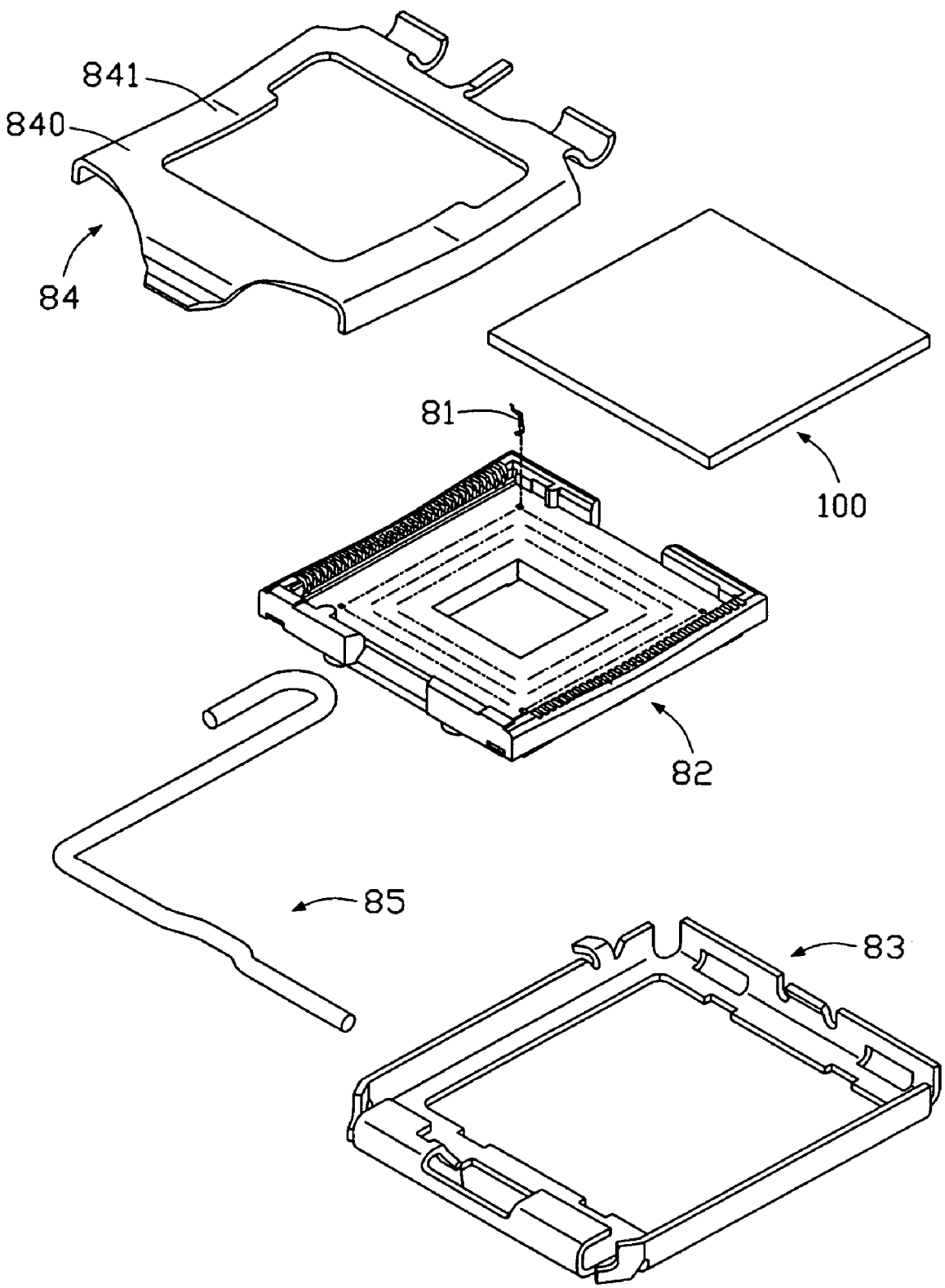
FIG. 5 is an exploded, isometric view of a conventional land grid connector assembly, together with an LGA chip.
Figure 6:
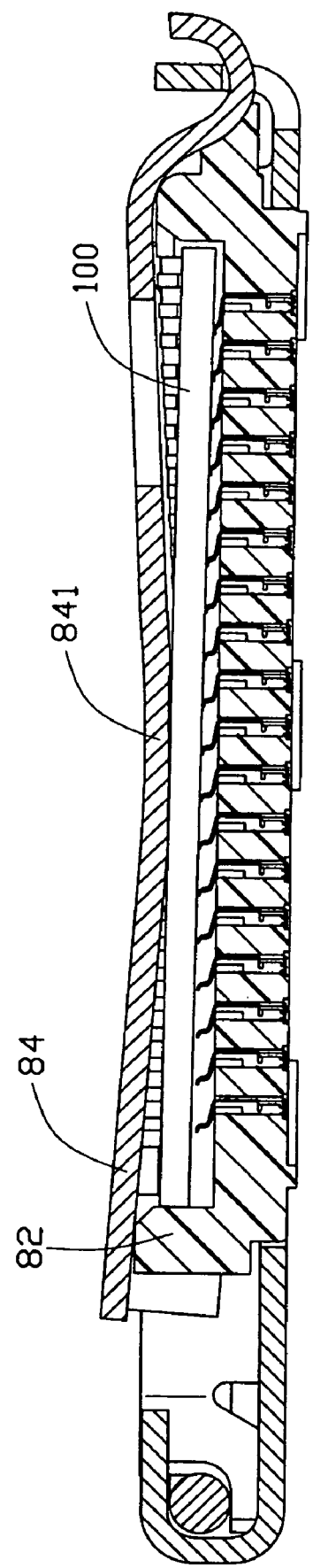
FIG. 6 is a cross-sectional view, taken along line VI—VI of FIG. 5.

Referring to FIGS. 1 and 2, the clip 40 has two opposite first slant sides 41 and two opposite second slant sides 42 bent to the housing 10 and adjacent the first sides 41, respectively. An engaging portion 411 is extended arcuately from one of the first sides 41 thereof. A pair of spaced securing portions 412 is extended arcuately from the other of the first sides 41 thereof and pivotably received in the slots 221 of the stiffener 20, and a tail 413 between the securing portions 412. A first pressing portion 421 is bent to the housing 10 in a middle portion of the second side 42. A second pressing portion 422 with a cantilever configuration is extended from an end of the first pressing portion 421, is adjacent to the engaging portion 411. A clasping portion 423 is formed at a distal end of the second pressing portion 422. The pressing portion 421 and the clasping portion 423 can press the LGA chip 60 onto the terminals 12. When the clip 40 is oriented at the horizontal position, the engaging portion 411 of the clip 40 engages with the actuating portion 35 of the lever 30, thereby pressing the LGA chip 60 on the terminals 12. When the clip 40 is oriented at a vertical position perpendicular to the housing 10, the tail 413 abuts against the stiffener 20 to prevent the clip 40 from being over-rotated.

Referring to FIGS. 1–4, when the clip 40 is oriented at the vertical, the LGA chip 60 is positioned in the cavity 14 of the housing 10 to make the leads of the LGA chip 60 contact the corresponding terminals 12 in the housing 10. The clip 40 is rotated from the vertical position to the horizontal position, thereby the first pressing portion 421 and the clasping portion 423 touch on the LGA chip 60. The lever 30 is rotated until the actuating portion 35 touches and presses on the engagement portion 411 of the clip 40, the operating portion 32 of the lever 30 being locked in the locking hook 210 of the stiffener 20 in the end for locking the clip 40. The clip 40 is pressed by the lever 30 and the first pressing portion 421 and the clasping portion 423 of the clip 40 impact the LGA chip 60 so that the leads of the LGA chip 60 touches on the terminals 12 received in the housing 10. The force of the clip 40 operating on the LGA chip 60 can maintain a reliable electrical connection between the contacts pads on the LGA chip and respective terminals 12 in the housing 10.

The first pressing portion 421 and the clasping portion 423 are formed on the clip 40 and can press the LGA chip 60 on the housing 10. This improves the connecting between the clip 40 and the LGA chip 60 from one point connection to two-point connection. The pressing force with two points connection is the same as the force with one point connection. Because the clasping portion 423 is adjacent a corner A of the housing 10 (best seen in FIG. 1), when the clasping portion 423 presses on the LGA chip 60, the pressing force that the clasping portion 423 operates on the LGA chip 60 is in a downward direction. The friction that the LGA chip 60 operates on the corner A of the housing 10 is in a upward direction. The pressing force that the clasping portion 423 operating on the LGA chip 60 can prevent the LGA chip 60 from moving upwardly, so that the steady electrical connection between the LGA chip 60 and the connector assembly 1 is obtained.

In addition, rigidity of the housing 10 is improved with the stiffener 20 made of rigid material being equipped on the housing 10. So the two opposite end of the housing 10 will not slope when the clip 40 presses the housing 10 on the center of the housing 10. The force that the housing 10 operates on the clip 40 and the lever 30 will not decrease. The force that the clip 40 operates on the LGA chip 60 will not decrease at same time, so that the steady electrical connection between the leads on the LGA chip 60 and the corresponding terminals 12 in the housing 10 will be ensured.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A land grid array (LGA) connector assembly comprising:
   an insulative housing defining art upward cavity therein and a lengthwise direction with two opposite ends thereof;
   an electronic package received in the cavity;
   a plurality of terminals disposed in the housing with upper contacting portion upwardly extending into the cavity to engage the electronic package;
   a metal clip pivotally disposed upon the housing with a pivotal end located around one of said two ends of the housing, and a locking end located around the other of said two ends for locating said metal clip in position;
   the metal clip defining at least one relatively rigid pressing portion pressing downwardly against the electronic package, and another relatively resilient pressing portion spaced from said relatively rigid pressing portion and pressing downwardly against the electronic package too, the relatively resilient pressing portion extending from one end of the relatively rigid pressing portion along a same direction toward to the locking end.

2. The connector assembly as claimed in claim 1, wherein said relatively rigid pressing portion is located closer to a middle portion of metal clip than said relatively resilient pressing portion.

3. The connector assembly as claimed in claim 1, wherein said relatively rigid pressing portion is cantilevered.

4. The connector assembly as claimed in claim 1, wherein said relatively resilient pressing portion is located closer to the locking end than the pivotal end.

5. The connector assembly as claimed in claim 4, wherein said relatively resilient pressing portion extends along said lengthwise direction.

6. The connector assembly as claimed in claim 5, wherein said relatively resilient pressing portion is located on a periphery of an opening defined in said metal clip.

7. A land grid array (LGA) connector assembly comprising:
- an insulative housing defining an upward cavity therein and a lengthwise direction with two apposite ends thereof;
- an electronic package received in the cavity;
- a plurality of terminals disposed in the housing with upper contacting portions upwardly extending into the cavity to engage the electronic package;
- a metal clip pivotally disposed upon the housing with a pivotal end located around one of said two ends of the housing, and a locking end located around the other of said two ends for locking said metal clip in position; and
- the metal clip defining one primary pressing portion around a middle portion thereof in said lengthwise direction, and one auxiliary pressing portion extending from the primary pressing portion and being closer to the locking end; wherein
- both of said primary pressing portion and said auxiliary pressing portion downwardly press against thy electronic package to prevent an end of the electronic package closer to the locking end from moving upwardly.

8. The connector assembly as claimed in claim 7, wherein said auxiliary pressing portion extends along the longitudinal direction toward the locking end.

* * * * *